US008374807B2

(12) United States Patent
Hall

(10) Patent No.: US 8,374,807 B2
(45) Date of Patent: Feb. 12, 2013

(54) METHOD AND APPARATUS THAT DETECTS STATE OF CHARGE (SOC) OF A BATTERY

(75) Inventor: A. Daniel Hall, Friendswood, TX (US)

(73) Assignee: Lockheed Martin Corporation, Bethesda, MD (US)

(*) Notice: Subject to any disclaimer, the term of this patent is extended or adjusted under 35 U.S.C. 154(b) by 424 days.

(21) Appl. No.: 12/616,593

(22) Filed: Nov. 11, 2009

(65) Prior Publication Data

US 2010/0121591 A1  May 13, 2010

Related U.S. Application Data

(60) Provisional application No. 61/114,128, filed on Nov. 13, 2008.

(51) Int. Cl.
  *G01R 31/36* (2006.01)
(52) U.S. Cl. ........................................................ 702/63
(58) Field of Classification Search .................. 702/63
  See application file for complete search history.

(56) References Cited

U.S. PATENT DOCUMENTS

| 4,952,862 | A | 8/1990 | Biagetti et al. |
|---|---|---|---|
| 5,349,540 | A | 9/1994 | Birkle et al. |
| 6,064,182 | A * | 5/2000 | Eguchi .................... 320/132 |
| 6,359,419 | B1 | 3/2002 | Verbrugge et al. |
| 6,366,054 | B1 | 4/2002 | Hoenig et al. |
| 6,388,447 | B1 | 5/2002 | Hall et al. |
| 6,621,250 | B1 | 9/2003 | Ohkubo et al. |
| 6,639,385 | B2 | 10/2003 | Verbrugge et al. |
| 7,212,934 | B1 | 5/2007 | Hall et al |
| 7,233,128 | B2 | 6/2007 | Brost et al. |
| 7,324,902 | B2 | 1/2008 | Verbrugge et al. |
| 2001/0033169 | A1* | 10/2001 | Singh et al. ................... 324/426 |
| 2002/0120906 | A1 | 8/2002 | Xia et al. |
| 2007/0139015 | A1 | 6/2007 | Seo et al. |
| 2007/0159137 | A1* | 7/2007 | Verbrugge et al. ............. 320/132 |
| 2008/0030169 | A1 | 2/2008 | Kamishima et al. |
| 2009/0157335 | A1* | 6/2009 | Zhang et al. ..................... 702/63 |

OTHER PUBLICATIONS

Linear Polarization Resistance (LPR), http://corrosion-doctors.org/Electrochem/LPR.htm, printed Jul. 30, 2012.*
Custom Power Solutions; State of Charge (SOC) Determination; 2005.

* cited by examiner

*Primary Examiner* — Michael Nghiem
(74) *Attorney, Agent, or Firm* — Ronald E. Prass, Jr.; Prass LLP

(57) ABSTRACT

A method and apparatus are provided for estimating a state of charge (SOC) of a battery. Curves are generated to expresses a relationship between a first parameter and an SOC over a region of interest. A voltage and a current of the battery during a period of time are measured to create a set of voltage and current data, which is then processed to create a set of processed data. The processed data is then combined with the generated curves to generate processed data as a function of SOC. A curve is generated that evaluates each SOC for accuracy and chance likelihood of fit. An SOC that minimizes both the error and chance is selected and output for display to the user on a user interface.

7 Claims, 12 Drawing Sheets

METHOD AND APPARATUS THAT DETECTS STATE OF CHARGE (SOC) OF A BATTERY

PRIORITY INFORMATION

This application claims priority from U.S. Provisional Patent Application Ser. No. 61/114,128, filed Nov. 13, 2008, the contents of which are incorporated herein by reference in its entirety.

BACKGROUND

1. Field of the Disclosed Embodiments

The disclosure relates to batteries, and in particular, detecting the state of charge of a battery.

2. Introduction

The State of Charge (SOC) of a battery is its available capacity expressed as a percentage of its rated capacity. Knowing the amount of energy left in a battery compared with the energy it had when it was new gives the user an indication of how much longer a battery may continue to perform before it needs recharging. As a battery is used, the SOC decreases unless the battery is recharged.

Conventional methods of determining SOC are cumbersome and less than accurate. In process that involves direct measurement, this process would be easy if the battery could be discharged at a constant rate. The charge in a battery is equal to the current multiplied by the time for which it flowed. Unfortunately there are two problems with this. In all practical batteries, the discharge current is not constant but diminishes as the battery becomes discharged, usually in a non-linear way. Any measurement device may therefore be able to integrate current over time. Secondly, this process depends on discharging the battery to know how much charge it contained. In most applications except perhaps in qualification testing, the user (or the system) needs to know how much charge is in the cell without discharging it.

There is also a process called voltage-based SOC estimation which uses the voltage of the battery cell as the basis for calculating SOC or the remaining capacity. Results can vary widely depending on actual voltage level, temperature, discharge rate and the age of the cell and compensation for these factors may be provided to achieve a reasonable accuracy. However, problems can occur with some cell chemistries, particularly lithium which exhibits only a very small change in voltage over most of the charge/discharge cycle.

Current-based SOC estimation is another conventional process that measures the current entering and leaving the cells as a basis for remaining capacity calculation. The charge transferred in or out of the cell is obtained by accumulating the current drain over time. This method, known as Coulomb counting, provides higher accuracy but it still needs compensation for the operating conditions as with the voltage based method. The simplest method of determining the current is by measuring the voltage drop across a low ohmic value, high precision, series and sense resistor. This process of measuring current causes a slight power loss in the current path and also heats up the battery. Hall effect and magneto-resistive transducers avoid this problem but they are more expensive. The former is inaccurate for low currents and the latter can not tolerate high currents and is susceptible to noise. Coulomb counting depends on the current flowing in external circuits and does not take account of self discharge currents. This can be the source of accumulating errors unless the monitoring circuit is regularly reset or calibrated As batteries are non-linear, voltage characteristics are a function of discharge rate, temperature and age. In another conventional technique, the individual cell model can be constructed from a set of "look-up tables" which provide stepwise approximations of the performance response curves which represent the cell discharge performance as a function of temperature, discharge rate or other parameters. The necessary look-up tables are developed from laboratory measurements under controlled conditions and may be different for each cell chemistry and cell construction. However, this process requires large amounts of data and large numbers of look up tables. As the battery begins to age, the models based on look-up tables model begin to lose effectiveness.

SUMMARY

A method and apparatus for estimating a state of charge of a battery. The method may include generating one or more curves which express the a priori relationship between a first parameter and a state of charge (SOC) of a battery over a region of interest, taking a derivative of the generated one or more curves with respect to state of charge to generate a derived parameter with the SOC of the battery over the region of interest, transforming a combination of the generated one or more curves into one or more supplemental curves which express an a priori relationship based on the cell chemistry between a second parameter with one or more of current (I), polarization current (Ip) and open circuit voltage (OCV), the voltage slope with respect to SOC (dOCV/dSOC), and any combination of (I, Ip, OCV, and dOCV/dSOC), measuring a voltage and a current of the battery during a period of time to create a set of voltage and current data, processing the set of voltage and current data to create a set of processed data, combining one or more generated curves with the processed data to generate processed data as a function of SOC, regressing the process data function at multiple SOCs over the region of interest with respect to an equation which is representative of the battery to obtain values for parameters not associated with SOC and to generate a curve that evaluates each SOC for accuracy and chance likelihood of fit, selecting the SOC that minimizes both the error and chance occurrence, and outputting the selected SOC for display to the user on a user interface.

BRIEF DESCRIPTION OF THE DRAWINGS

In order to describe the manner in which the above-recited and other advantages and features of the disclosed embodiments can be obtained, a more particular description of the disclosed embodiments briefly described above may be rendered by reference to specific embodiments thereof which are illustrated in the appended drawings. Understanding that these drawings depict only typical disclosed embodiments and are not therefore to be considered to be limiting of its scope, the disclosed embodiments may be described and explained with additional specificity and detail through the use of the accompanying drawings in which.

DETAILED DESCRIPTION OF THE DISCLOSURE

Additional features and advantages of the disclosure may be set forth in the description which follows, and in part may be obvious from the description, or may be learned by practice of the disclosure. The features and advantages of the disclosure may be realized and obtained by means of the instruments and combinations particularly pointed out in the appended claims. These and other features of the present disclosure may become more fully apparent from the following description and appended claims, or may be learned by the practice of the disclosure as set forth herein.

Various embodiments of the disclosure are discussed in detail below. While specific implementations are discussed, it should be understood that this is done for illustration purposes only. A person skilled in the relevant art may recognize that other components and configurations may be used without parting from the spirit and scope of the disclosure.

The disclosure comprises a variety of embodiments, such as a method and apparatus and other embodiments that relate to the basic concepts of the disclosure. Knowing the battery state of charge on the any electrical power system facilitates critical decisions for power management for many complex systems. The disclosed embodiments may concern a method, apparatus and computer readable medium for detecting the state of charge (SOC) of a battery. In particular, the disclosed embodiments may concern a process that may determine an a priori relationship of polarization resistance with SOC. The relationship of resistance with SOC may be better suited for a deterministic function and allows an independent assessment of SOC without coulomb counting.

The disclosed embodiments may concern a method of regression that focuses on fitting a known invariant unloaded voltage curve and its associated derivative with respect to SOC and a second parameter derived from the previous curves associated with the current and SOC to loaded battery data to extract the SOC. Some of the aspects may be:

An equation for relating polarization current and dOCV (SOC)/dSOC to describe voltage drop may be used.

Figure 6:
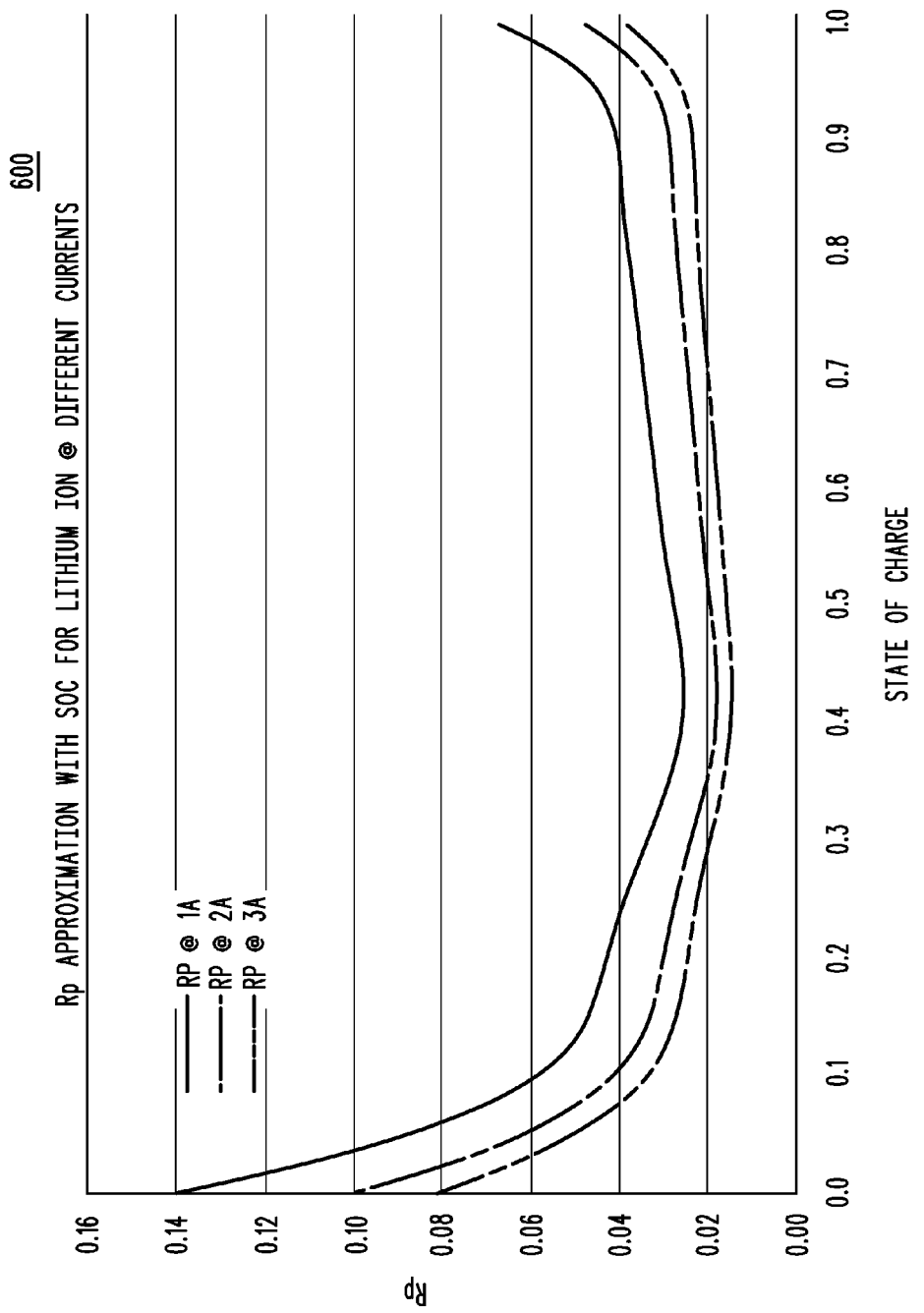
FIG. 6 is a graph of Rp2(SOC, Ip) as a function of State of Charge and shown for three values of Ip for a lithium ion battery in accordance with a possible embodiment of the disclosure.

The basis for the polarization resistance (Rp) equation may be derived from a theoretical analysis of polarization voltage drop using a distributed capacity perspective relative to open circuit voltage. This new derivation may allow the Rp to be decomposed into two functions. The first may be dependent on state of charge Rp1(SOC,Ip) (as shown in FIG. 6) and the second may be dependent purely on temperature Rp2(T). This derivation may describe Rp1(SOC,Ip) with well known observed characteristics of batteries, such as 1) the non-linear decrease of resistance with increasing current, 2) The characteristic bowl shape of the resistance with state of charge, and 3) The observed differences between charge and discharge polarization at different states of charge. The separation of variables may allow regression analysis to identify Rp2(T) without needing to know the temperature for the battery itself.

$$Rp=Rp1(SOC,Ip)*Rp2(T).$$

OCV(SOC) and dOCV(SOC)/dSOC parameters may be baselined for the particular battery chemistry and may be invariant thought-out battery life.

Regression may allow use of invariant known OCV(SOC) curve and derivatives and extraction of parameters related to resistance to predict state of charge.

This process may result in a true simplification of SOC indication in batteries which may be a significant problem for all battery applications.

This process may use an equation with non linear relationship with polarization current and use of dOCV(SOC)/dSOC to describe voltage drop in a battery. The basis may be derived from a theoretical analysis of polarization voltage drop from an idealized battery composed of infinite strings at different voltages. The analytical approach may allow prediction of relationship of polarization resistance with SOC and current based on the invariant equilibrium OCV(SOC) curve. OCV (SOC) parameters may be baselined for the particular battery chemistry and may be invariant throughout battery life. These invariant parameters may be used to describe the invariant part of the polarization resistance Rp1(SOC,Ip). Voltage relationships may be identified throughout life from changes of the polarization Rp2(T), and ohmic resistances Rohmic. These can be regressed during operation and allow full description of battery behavior. The actual capacity may be calibrated easily as needed using SOC and short term coulomb integration.

The regression method may include using equations and known capacity. Note the following definitions:

OCV: Open Circuit Voltage;

Rp: Polarization Resistance where $Rp=Rp1(SOC,Ip)*Rp2(T)$.

dOCV/dSOC: OCV Slope with Capacity

Extraction and separation of Rp2(T) from Rp may decrease sensitivity to temperature. During the analysis Rp1(SOC,Ip) may be calculated but Rp2(T) may be regressed since $Rp=Rp2(T)*(dOCV(SOC)/dSOC*IP)^{1/2}$, where in this case, $Rp1(SOC,Ip)=(dOCV(SOC)/dSOC*IP)^{1/2}$. OCV and dOCV/dSOC may be used to estimate SOC on parametric curve by minimizing the error of the baseline curve and the processed data.

Alternate multivariate regressions may be performed by:

1) using three variables: current, and capacity, and polarization current to regress output (coulomb based) OCV and dOCV/dSOC, Rp, and Rohmic were OCV is the constant and dOCV/dSOC is the slope with capacity, Rp is the slope with polarization voltage and Rohmic is the slope with current;

2) A SOC estimate may be achieved by looking up OCV and dOCV/dSOC on a parametric curve;

3) The estimated SOC may be used to calculate a Rp1 (SOC,Ip);

4) From the regressed Rp=Rp1(SOC,Ip)*Rp2(T) and the calculated Rp1(SOC,Ip), the value of Rp2(T) may be extracted;

5) a simplified multivariate regression may be rerun using only two variables current and polarization current with calculated values of SOC and δOCV/dSOC from the estimate and output a new regressed Rp; and 6) from the previous extracted Rp2(T) and the new regressed Rp and the equation Rp=Rp2(T).*(dV(SOC)/dSOC*Ip)^1/2 isolate the value dOCV/dSOC.

Correction may be performed by adjusting the SOC until the coulomb based output dOCV/δSOC and resistance based output dOCV/dSOC difference may be minimized. Based on the correction model, the SOC may be predicted from a single pulse set of data.

Figure 1:
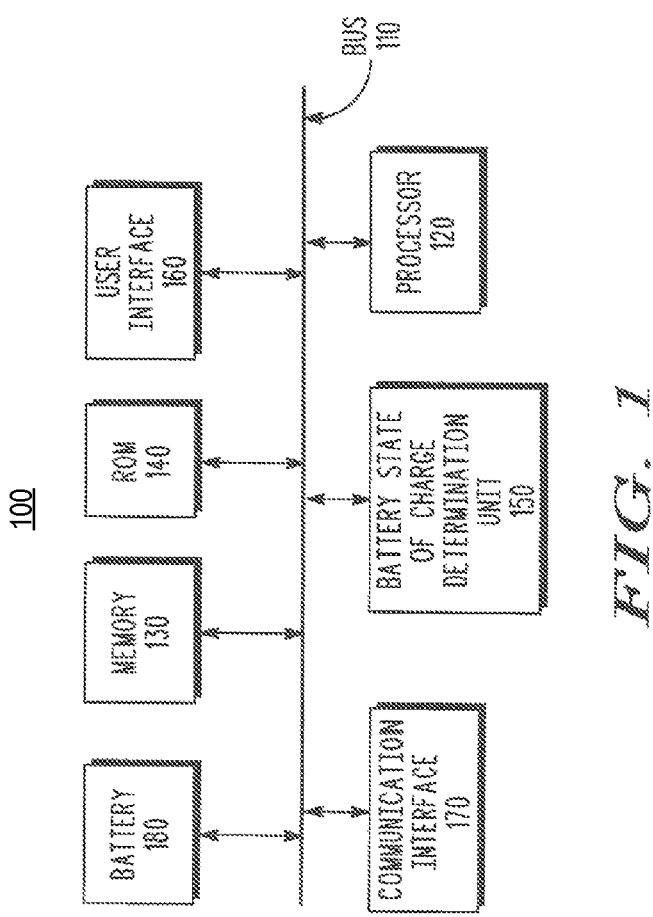
FIG. 1 is an exemplary block diagram of a battery operated device in accordance with a possible embodiment of the disclosure.

FIG. 1 is a block diagram of an exemplary battery operated device 100 in accordance with a possible embodiment of the disclosure. The exemplary battery operated device 100 may include a bus 110, a processor 120, a memory 130, a read only memory (ROM) 140, a battery state of charge determination unit 150, a user interface 160, a communication interface 170, and a battery 180. Bus 110 may permit communication among the components of the battery operated device 100.

The battery operated device 100 may be any device that operates with a battery, such as a car, a truck, an aircraft, a motorcycle, a scooter, a boat, a military transport or combatant, a portable computer, a mobile telephone, a satellite telephone, a satellite, a spacecraft, a submarine, a MP3 player, a personal digital assistant (PDA), a portable communication device, a portable radio, a portable television, etc.

Processor 120 may include at least one conventional processor or microprocessor that interprets and executes instructions. Memory 130 may be a random access memory (RAM) or another type of dynamic storage device that stores information and instructions for execution by processor 120. Memory 130 may also store temporary variables or other intermediate information used during execution of instructions by processor 120. ROM 140 may include a conventional ROM device or another type of static storage device that stores static information and instructions for processor 120. Memory 130 may include an internal or external storage device that may include any type of media, such as, for example, magnetic or optical recording media and its corresponding drive.

User interface 160 may include one or more conventional input mechanisms that permit a user to input information, communicate with the battery operated device 100 to present battery-related information, SOC information, and/or present information to the user, such as a an electronic display, microphone, touchpad, keypad, keyboard, mouse, pen, stylus, voice recognition device, buttons, one or more speakers, etc.

Communication interface 170 may include any transceiver-like mechanism that enables the battery operated device 100 to communicate via a network. For example, communication interface 170 may include a modem, or an Ethernet interface for communicating via a local area network (LAN). Alternatively, communication interface 170 may include other mechanisms for communicating with other devices and/or systems via wired, wireless or optical connections. In some implementations of the battery operated device 100, communication interface 170 may not be included in the exemplary battery operated device 100 when the communication process is implemented completely within the battery operated device 100.

Battery 180 may represent any battery in a battery operated device 100 that may have its state-of-charge determined in accordance with the disclosed embodiments, such as a lead-acid battery, a flow battery, a lithium-ion battery, a nickel-cadmium battery, a nickel-zinc battery, a lithium iron phosphate battery, a lithium sulfur battery, a lithium-titanate battery, etc.

The battery operated device 100 may perform such functions in response to processor 120 by executing sequences of instructions contained in a computer-readable medium, such as, for example, memory 130, a magnetic disk, or an optical disk. Such instructions may be read into memory 130 from another computer-readable medium, such as a storage device, or from a separate device via communication interface 170.

The battery operated device 100 illustrated in FIG. 1 and described in the related description is intended to provide an illustrative, and non-limiting, exemplary embodiment. Although not required, the disclosed embodiments may be described, at least in part, in the general context of computer-executable instructions, such as program modules, being executed by the battery operated device 100, such as a general purpose computer. Generally, program modules include routine programs, objects, components, data structures, etc. that perform particular tasks or implement particular abstract data types. Moreover, those skilled in the art may appreciate that other embodiments of the disclosed embodiments may be practiced in network computing environments with many types of computer system configurations, including personal computers, hand-held devices, multi-processor systems, microprocessor-based or programmable consumer electronics, network PCs, minicomputers, mainframe computers, and the like.

Embodiments may also be practiced in distributed computing environments where tasks may be performed by local and remote processing devices that may be linked (either by hardwired links, wireless links, or by a combination thereof) through a communications network. In a distributed computing environment, program modules may be located in both local and remote memory storage devices.

Figure 2:
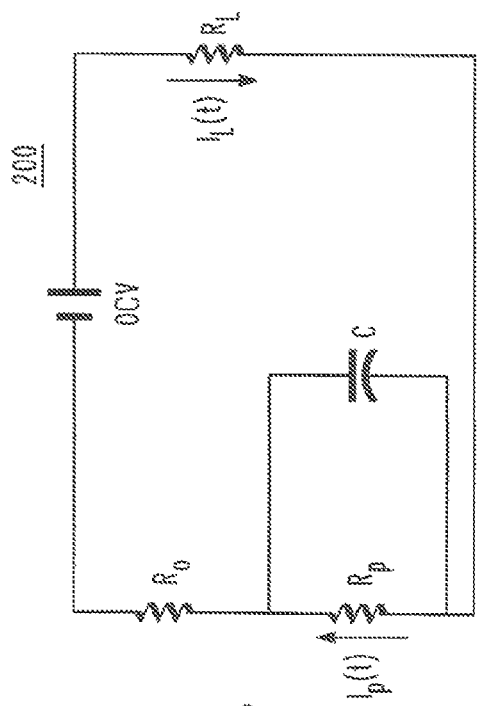
FIG. 2 is an exemplary battery circuit diagram in accordance with a possible embodiment of the disclosure.

FIG. 2 is an exemplary battery circuit diagram 200 in accordance with a possible embodiment of the disclosure. The exemplary battery circuit diagram 200 may include open circuit voltage (OCV), ohmic resistance (Ro), polarization resistance (Rp), load resistance (RL), load current (Il), polarization current (Ip), and capacitive time constant (tau). The OCV slope with capacity of the circuit may be found using dOCV/dSOC, for example.

The goal of examination of the circuit may be to determine Ro and Rp with respect to SOC. An equation for voltage can be created that has Il, Ip and SOC as its variables. Lp may be calculated by circuit analysis using Il and a system time constant tau. The coefficients—Ro, Rp, dOCV/dSOC', and OCV—may be calculated by multivariate linear regression, for example.

For illustrative purposes, the operation of the battery state of charge determination unit 150 and the battery state of charge determination process may be described below in FIG. 3 in relation to the block diagram shown in FIG. 1.

Figure 3:
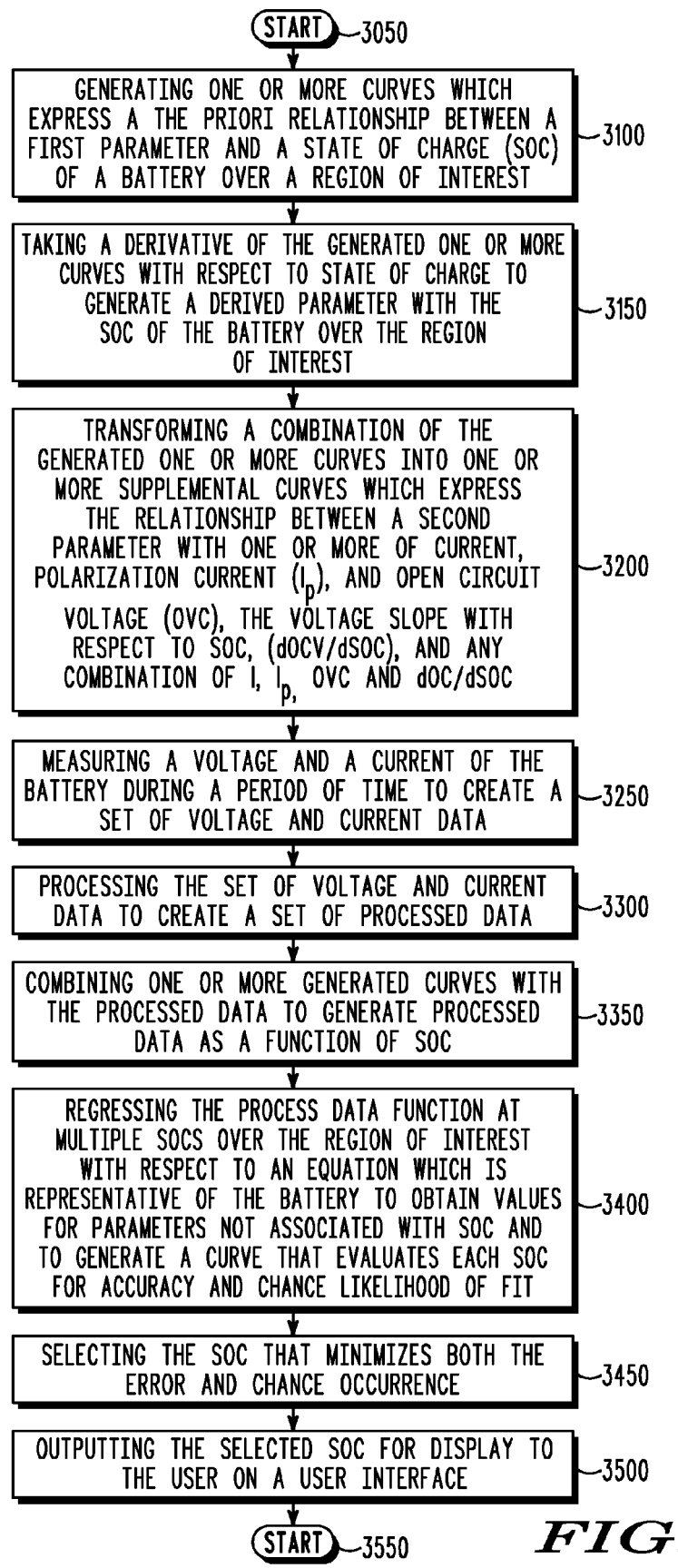
FIG. 3 is a flowchart of the state-of-charge determination process in accordance with a possible embodiment of the disclosure.

FIG. 3 is a flowchart of the state-of-charge determination process in accordance with a possible embodiment of the disclosure. The process begins at step 3050 and continues to step 3100 where the battery state of charge determination unit 150 may generate one or more curves which express the a priori relationship between a first parameter such as open circuit voltage and a state of charge (SOC) in FIG. 4 of a battery over a region of interest.

Figure 5:
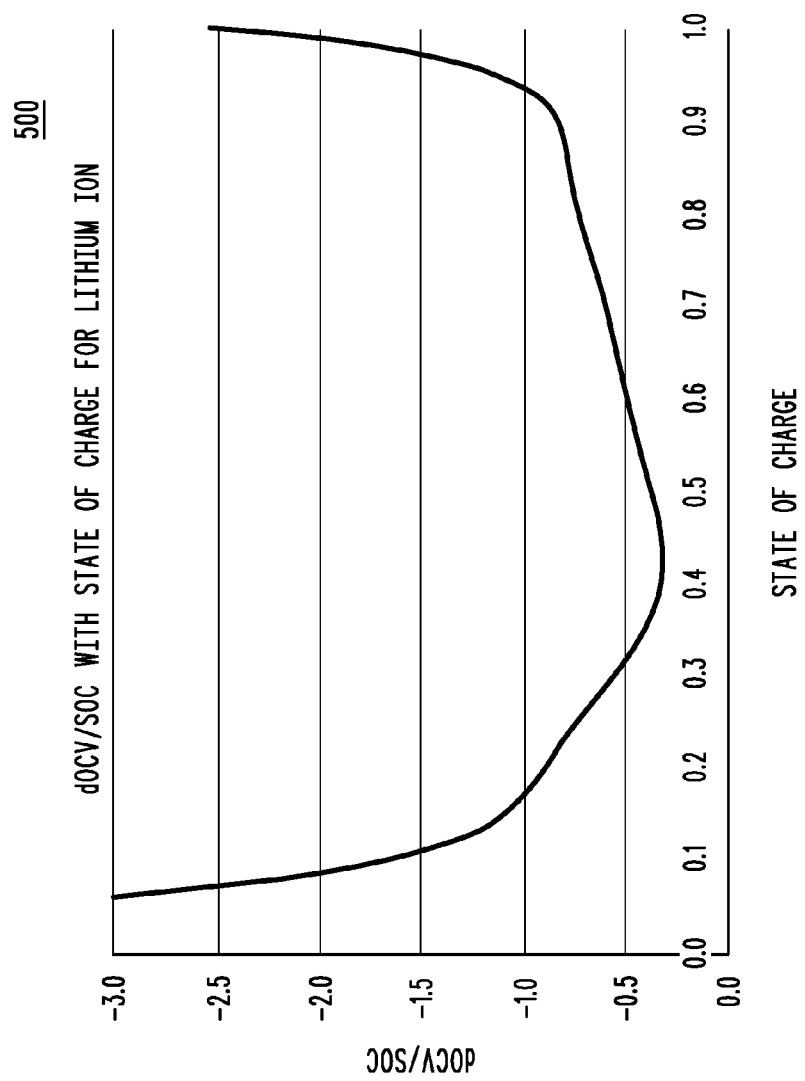
FIG. 5 is a graph of dOCV/dSOC as a function of State of Charge for a lithium ion battery in accordance with a possible embodiment of the disclosure.

At step 3150, the battery state of charge determination unit 150 may take a derivative of the curve with respect to state of charge to generate a derived parameter with the SOC as in FIG. 5 of a battery 180 over the region of interest. At step 3200, the battery state of charge determination unit 150 may transform a combination of the former curves into one or more supplemental curves which express the a priori relationship based on cell chemistry between a second parameter such as Rp polarization resistance (as shown for example, in FIG. 6) with one or more of current (I), polarization current (Ip), open circuit voltage (OCV), the voltage slope with respect to SOC (dOCV/dSOC), and any combination of (I, Ip, OCV, and dOCV/dSOC).

Figure 4:
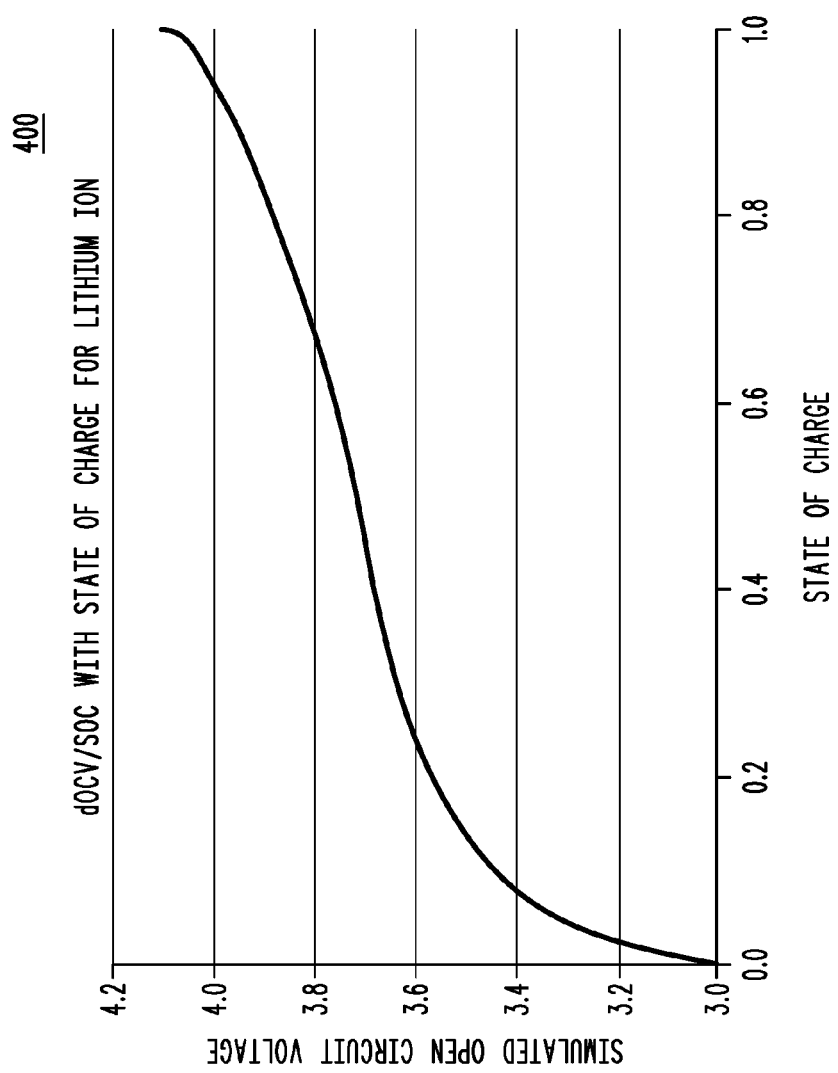
FIG. 4 is a graph of OCV as a function of State of Charge for a lithium ion battery in accordance with a possible embodiment of the disclosure.

FIG. 4 is a graph 400 of OCV as a function of state of charge for a lithium ion battery in accordance with a possible embodiment of the disclosure. This graph 400 may be used for the curves in this process, for example.

Through steps 3100-3200, characteristic open circuit voltage, with temperature for the specific battery or cell may be obtained prior to operation. In step 3200 the transformations discussed may be produced by modeling the battery by using the Capacity Distribution Perspective (CDP) shown in FIG. 10. This new derivation allows the Rp to be decomposed into two functions. The CDP derives the Rp by applying linear, Butler Volmer, or adhoc mods characteristics, in a distributed function across the capacity activated for a discharge voltage range. The voltage range may be the voltages between the OCV and the actual discharge voltage, for example. An example of the first derivation with an ohmic (linear) dependence across the capacity range may be illustrated in FIG. 6 and can be further simplified by approximating the value by using the resistance to the square root of the polarization current and the voltage slope, for example. In this manner, all the primary basis relationships for battery chemistry for OCV (SOC) (as shown for example, in FIG. 4), dOCV/dSOC (SOC) (as shown for example, in FIG. 5), Rp(SOC,Ip) as shown for example, in FIG. 6) may be calculated for use in the regression analysis set forth below. If the OCV varies with temperature tables of curves may be calculated at each temperature. Temperature effects due entropy on the OCV curve may be incorporated, if necessary. This process may allow theoretical entropy relationships for the equilibrium voltage to be easily accounted for in supplemental tables or by using the Nernst equation, for example. Once the resistance is known with SOC as well as the nonlinear behavior with current, a supplemental analysis for instantaneous power at a current and peak power may be possible.

A differential equation for polarization current may be generated using Kirchhoff's voltage rules by using the CDP function characteristic and a double layer capacitance value. In this process, the use of the CDP simplification may allow a derivation Tau*dIp/dt=(Il−Ip)*Ip1/2, where Tau may be equal to $1/2*C*Rp2(T)*(dOCV/dSOC)^1/2$. However, other differential equation derivations may be available if other CDP characteristics may be used or even if no CDP characteristic is used.

After the differential equation for polarization current may be generated, it may be used to process the load current Il to a polarization current Ip. These two currents with the capacity may form the three initial variables in the multivariate regression.

Figure 7:
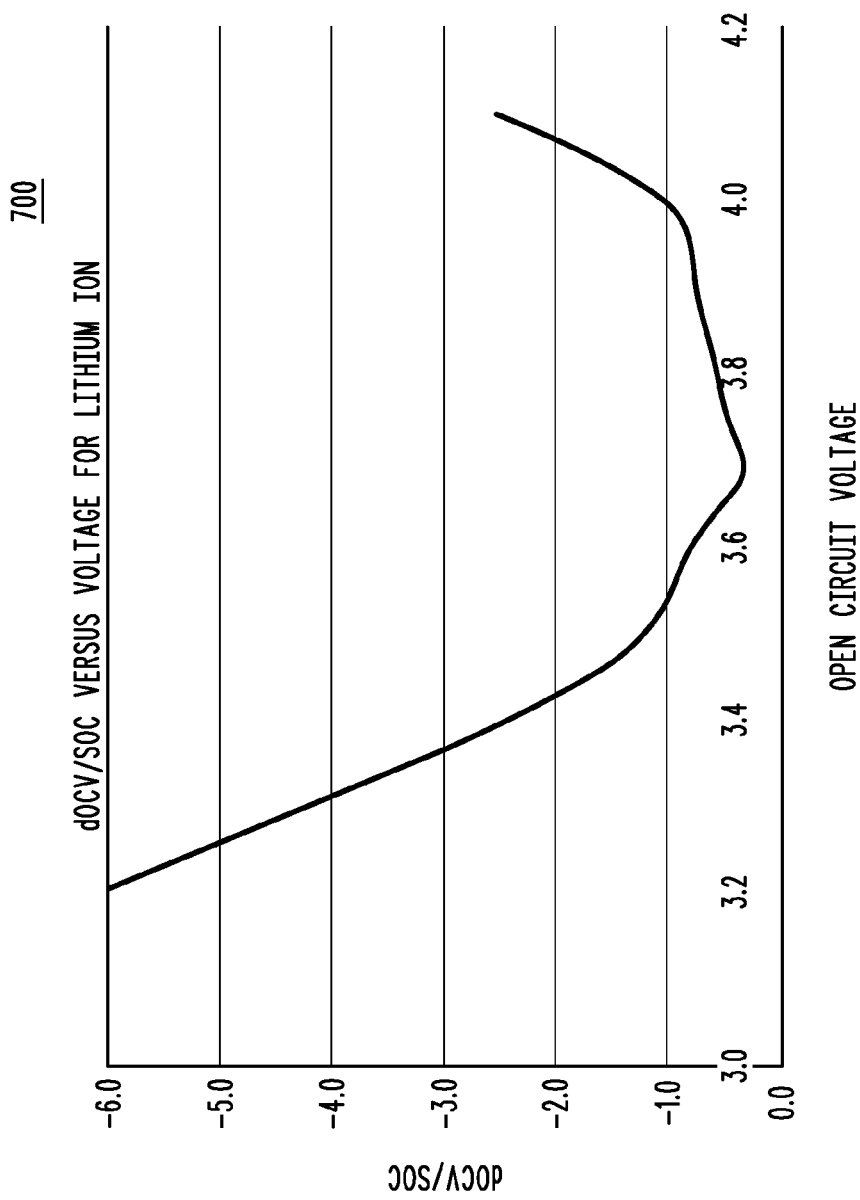
FIG. 7 is a parameterized curve of OCV and dOCV/dSOC where each point represents a triad of (SOC, OCV, dOCV/dSOC)
Figure 8:
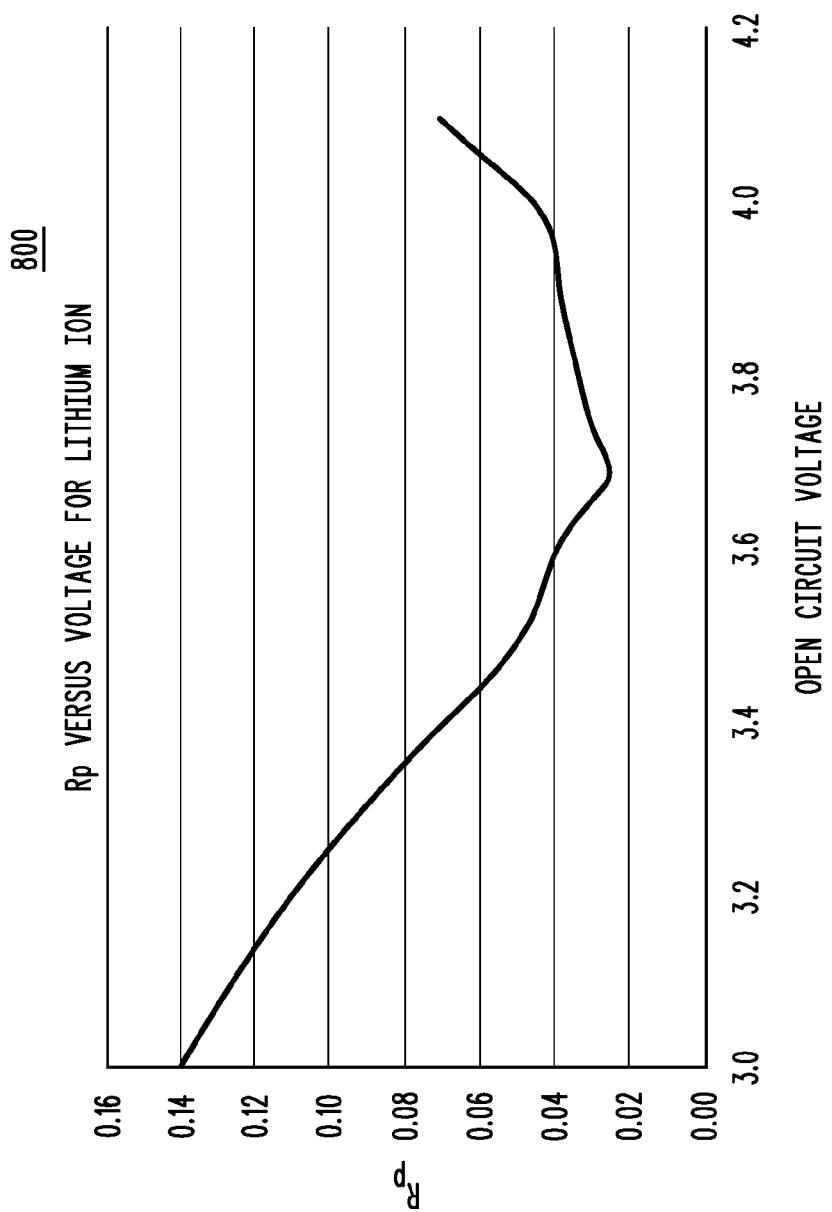
FIG. 8 is a parameterized curve of OCV and Rp where each point represents a triad of (SOC, OCV, Rp)
Figure 9:
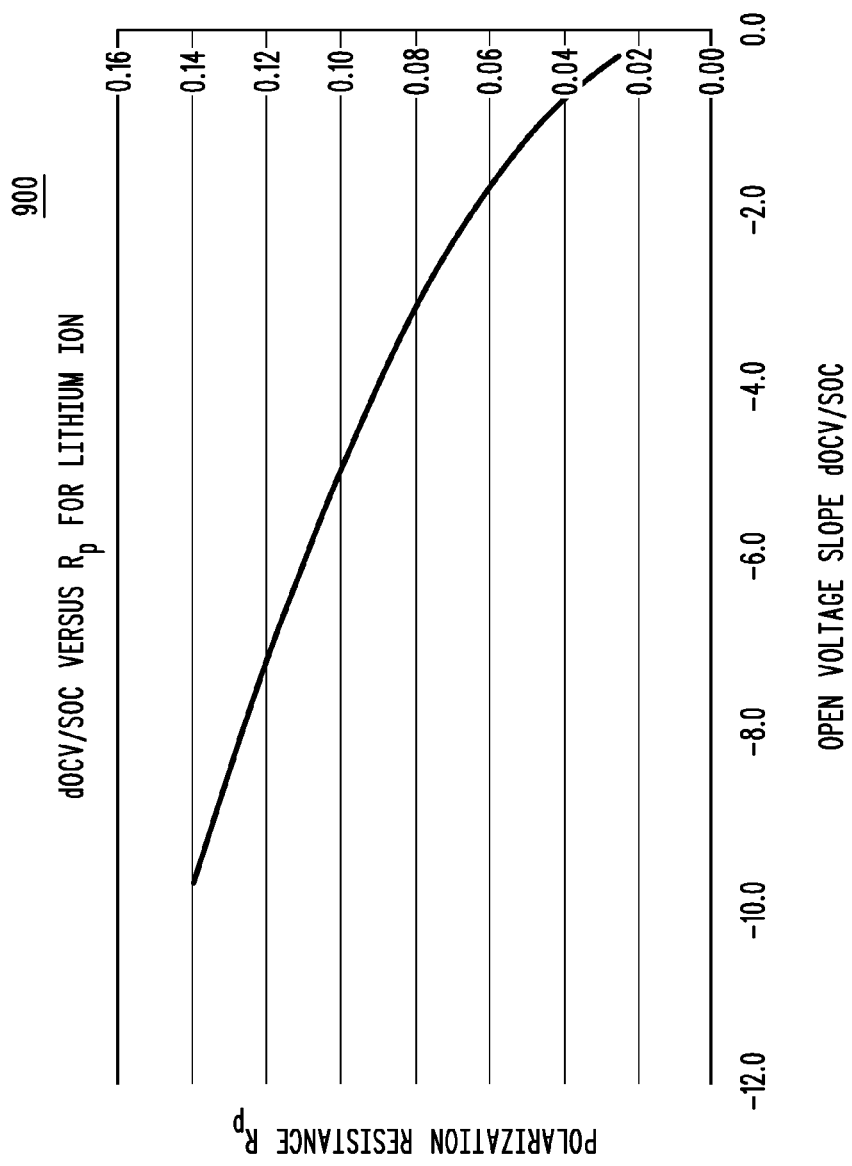
FIG. 9 is a parameterized curve of dOCV/dSOC and Rp where each point represents a triad of (SOC, dOCV/dSOC, Rp)

Supplemental curves to benefit capacity calibration and state of charge determination may use the parametric relationships. These curves may be constructed by taking two parameters that both relate to state of charge and relate them to each other. In this manner, the curve fit may become a two dimensional representation of state of charge. Each point may be a triad (parameter 1, parameter 2, SOC) that may uniquely describe that SOC. In this manner, a unique single valued curve with state of charge may be described in two dimensional spaces. Since one dimensional functions that output two values for a single input may not be used to uniquely identify a solution, the second curve may be used to uniquely identify the solution in two dimensional space: These curves may be various combinations of the original basis relationships, such as:

1) OCV(SOC) versus dOCV/dSOC(SOC), as shown for example, in FIG. 7;
2) OCV(SOC) versus Rp(SOC), as shown for example, in FIG. 8; and
3) dOCV/dSOC(SOC) versus Rp, as shown for example, in FIG. 9.

Figure 10:
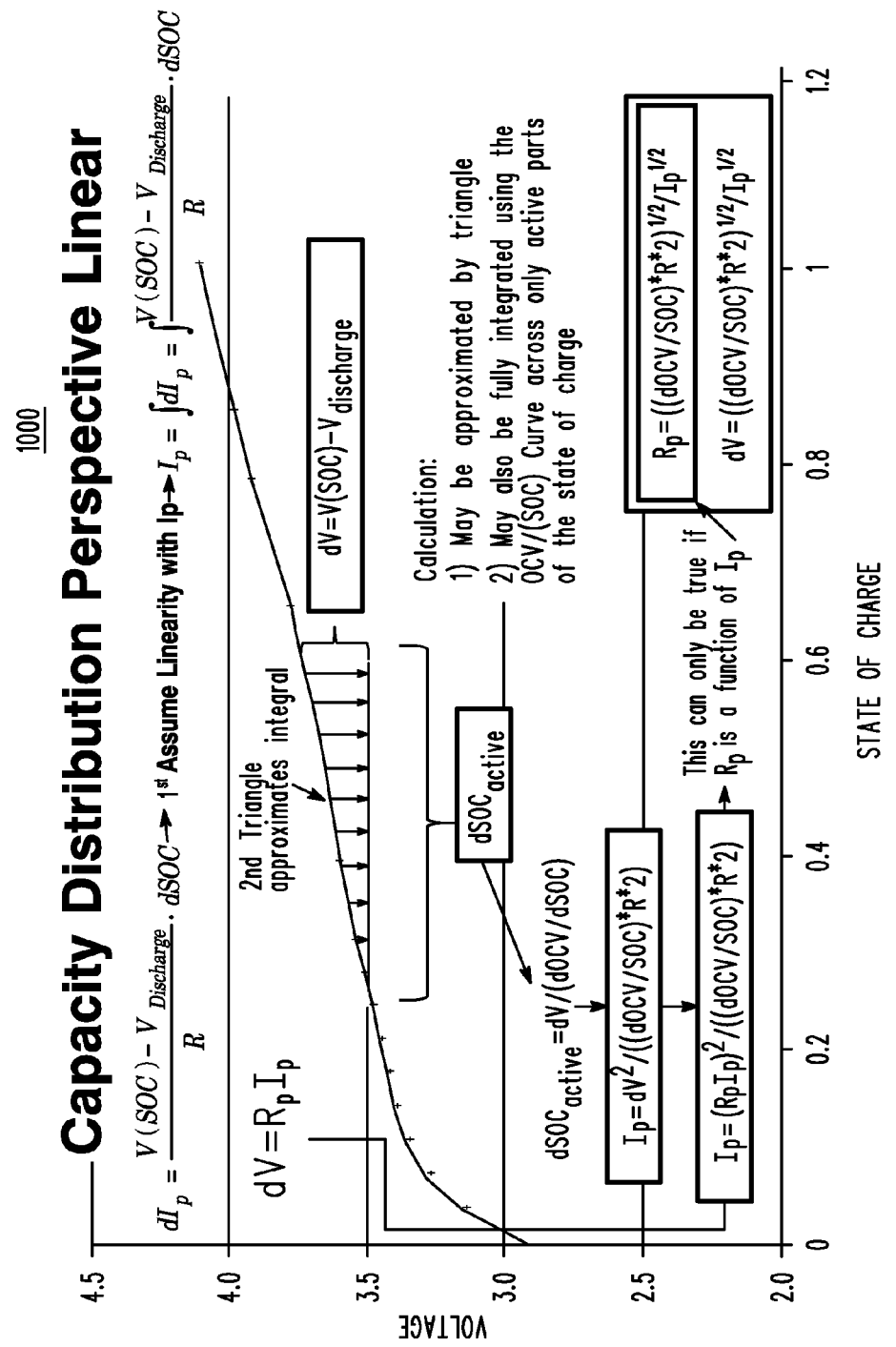
FIG. 10 is a graphical representation of how the Capacity Distribution Perspective (CDP) is derived along with the simplifying assumption.
Figure 11:
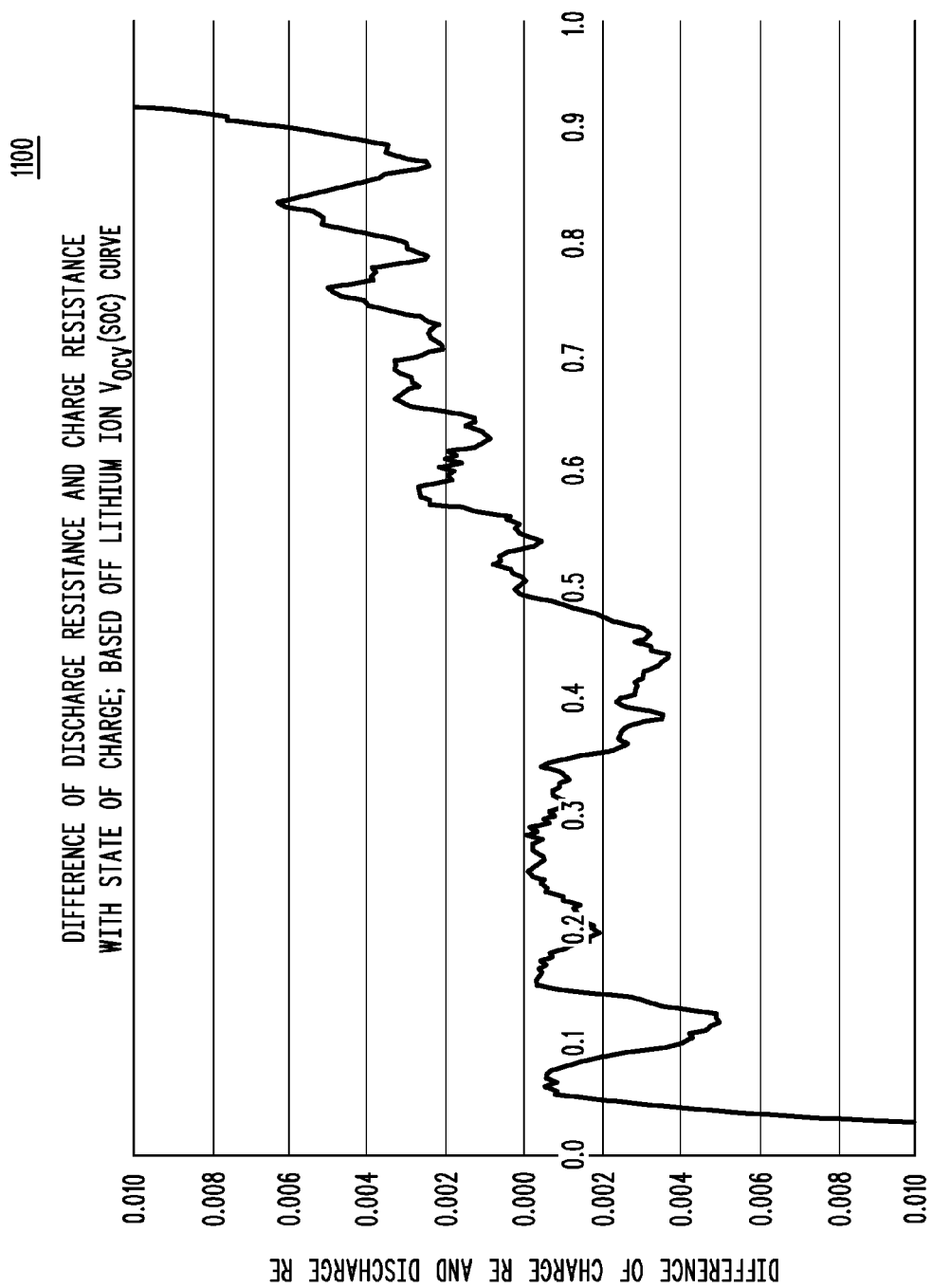
FIG. 11 is a graph of the difference between the charge Rp and the discharge Rp using the Capacity Distribution Perspective (CDP) without the simplification as described in the text.

An auxiliary method of state of charge determination may be performed by using the Rup versus Rdown(SOC, Ip) chart, as shown for example, in FIG. 11. As described above, the first CDP derivation for Rp1(SOC,Ip) as shown in FIG. 10 with an ohmic (linear) dependence across the capacity range as illustrated in FIG. 6, can be run for a discharge or a charge. The analysis may not assume the simplification discussed above. The curves produced for discharge and charge may be similar but not identical. The difference of the two curves may produce a somewhat rough single valued function across state of charge, Rup versus Rdown(SOC, Ip), as shown for example, in FIG. 11. The CDP allows calculation of Rdown (SOC, Ip) by looking at the active capacity on discharge as seen in FIG. 10. The Rup(SOC, Ip) is likewise calculated by the active capacity on charge. The difference between the two values is related to the OCV slope above the SOC as opposed the OCV slope below the SOC which is also the second derivative of the OCV curve, d2OCV/dSOC2. These curves may allow state of charge to be determined by comparison of the polarization resistance Rp(SOC,Ip) observed during a discharge versus a charge at the same state of charge. These values for Rp(SOC, Ip) can be determined by analyzing a single charge and discharge pulse and comparing the resistances. The regression may incorporate the current, the polarization current and the capacity. If pulse times are short, the regression can be simplified to the current and the polarization current. This auxiliary method may show an alternate way to use the CDP to achieve SOC indication. Other methods may be used by combining other CDP derived behaviors.

At step 3250, the battery state of charge determination unit 150 may measure a voltage and a current of the battery 180 during a period of time to create a set of voltage and current data. This data may be taken during brief concentrated data measurements perhaps for a period of 30 seconds, for example. The process may allow many restrictions to be lifted. Temperature measurements may not be necessary when battery basis relationships may be independent on temperature or weakly dependent on temperature. However, optional temperature measurements may be necessary if the battery's chemistry is sensitive, for example.

At step 3300, the battery state of charge determination unit 150 may process the set of voltage and current data to create a set of processed data. After the differential equation for polarization current is generated, it may be used to process the load current $I_L$ to a polarization current Ip. Also, after the CDP is derived, it may be used to further process the polarization current into a processed voltage drop as a function of polarization resistance without the $Rp^2(T)$ component. The polarization current may also be integrated to produce a transient capacity. In particular embodiments the voltage may be processed further by subtracting an OCV(SOCestimate) at the particular state of charge estimate. Finally, as the dependent variable, the voltage may undergo a multivariate regression with the independent variables the current, the voltage drop as a function of polarization resistance less the Rp2(T) component and the transient capacity. At step 3350, the battery state of charge determination unit 150 may combine one or more generated curves with the processed data to generate processed data as a function of SOC. FIG. 5 is a graph 500 of dOCV/dSOC as a function of state of charge and FIG. 4 is a graph of OCV as a function of state of charge both for a lithium ion battery in accordance with a possible embodiment of the disclosure and may be used in this process.

In steps 3300-3350, an initial educated estimate for SOC may be made and a typical value of tau may be used. The rated value for the capacity of the battery may also be used. A modified non-steady state voltage drop may then be calculated from the voltage data using an initial guess. i.e. nu((t) =V(t)−OCV(SOCestimate)). dOCV/dSOC(SOCestimate) may then be calculated. For each SOC estimate, the value of tau may be adjusted to minimize the error or the multivariate regression. In practice, the value of tau may be adjusted but since the values of the other variables are a product either of the regression or of SOC, the independent variable may be capacitance (C). This C value may be easily calculated from the results of the optimized regression. Although not shown in the figures, its value may be used for determination of state of charge in similar fashion to the as the other shown in the disclosed embodiments.

For all current data points, polarization current may be calculated from the actual current measurement, the initial estimate of the double layer capacitance, and the derived differential equation $1/2*C*Rp2(T)*(dOCV/dSOC)^{1/2}*dIp/dt=(II-Ip)*Ip^{1/2}$, from above (i.e., the CDP simplification) and the $((dOCV/dSOC)1/2*Ip)^{1/2}$. Note however, that a tailored polarization current may be calculated using a different CDP relationship (e.g., Butler Volmer, exponential, etc.) to derive the differential equation.

Next, using the CDP simplification voltage drop derivation, the voltage drop as a function of polarization resistance. i.e. $dOCV/dSOC(SOCestimate)*Ip^{1/2}$ may be calculated for all the data points. However, as an option, a tailored voltage drop may be calculated using a different CDP relationship (Butler Volmer, exponential, etc.) as a function of polarization current, for example.

At step 3400, the battery state of charge determination unit 150 may regress the process data function at multiple SOCs over the region of interest with respect to an equation which may be representative of the battery 180 to obtain values for parameters not associated with SOC and to generate a curve that evaluates each SOC for accuracy and chance likelihood of fit. The following variables may be used non-steady state voltage drop nu(t), current and $(dOCV/dSOC(SOCestimate)*Ip)^{1/2}$. The value of $(dOCV/dSOC(SOCestimate)*Ip)^{1/2}$ may be Rp1(SOC,Ip) or the voltage drop as a function of polarization resistance less the Rp2(T) component. Expected constants may be Rohmic and Rp2(T). The double layer capacitance may be calculated using $tau=C*Rp2(T)*(dOCV/dSOC)^{1/2}/2$ and the regression may be performed using the SOC guess, for example.

At this point, the regression may be rerun after updating tau based on regressed Rp2(T). $Tau=C*Rp2(T)*(dOCV/dSOC)^{1/2}/2$, for example. In cases where the battery temperature is changing, tau may need to be adjusted as the process continues per Rp2(T). This process may be readily performed as regressed values or Rp2(T) may be available from each regression performed. In this manner, the regressed output of Rp2(T) may allow the tracking of temperature by comparing the resistance value with an a priory table.

As an alternative, an expanded multivariate regression may be performed using V(t) against Int(Ip,t), I and $(dOCV/dSOC(SOCestimate)*Ip)^{1/2}$ with an educated guess for SOC estimate. Constants from the regression may be obtained directly Rp2*(T), Rohmic, dOCV/dSOC(SOC), and OCV, for example. SOCestimate may adjusted until regressed constants dOCV/dSOC(SOC) and OCV match calculated constants from tables dOCV/dSOC(SOCestimate) and OCV (SOCestimate). Differences in the regressed values and calculated values may be minimized by using parameterized plots and minimizing error on plots according to a optimized plan, for example.

As another option, an expanded multivariate regression may be performed again on the same data using V(t) against Int(Ip,t), I and $(Ip)^{1/2}$ and the Rp2(T) regressed previously. Constants from the regression may be obtained directly, Rohmic, dOCV/dSOC(SOC), and OCV and $Rp2(T)*(OCV/dSOC(SOC))^{1/2}$. SOCestimate may be adjusted until the regressed constants dOCV/dSOC(SOC) and OCV and $(OCV/dSOC(SOC))^{1/2}$ match calculated constants from tables dOCV/dSOC(SOCestimate), OCV(SOCestimate), and $(OCV/dSOC(SOCestimate))^{1/2}$. The differences in regressed values and calculated values may be minimized by using a priori parameterized plots to minimize the error on plots according to an optimized plan. A three dimensional parameterized plot can be generated where a quadrad may be constructed where each state of charge may be associated with three values $\{SOC, dOCV/dSOC(SOC), OCV, (OCV/dSOC(SOC))^{1/2}\}$. This quadrad may be a three dimensional representation of the state of charge. The output of the regression may be compared against the quadrad in three dimensional space. By adjusting the SOC and the derived output of the other variables and comparing it to the actual regression output, the error can be minimized. Weighting of a particular parameter can be performed as needed for the particular application. Other dimensional pairings or higher order pairing may be performed from the available curves.

A further option may be to regress certain values, calculate other values directly, and then, minimize the regressed values. This option may allow one to mix and match to fit the application's needs. The differences in regressed values and calculated values may also be minimized by using parameterized plots and minimizing error on plots according to an optimized plan, for example.

Note that steps 3300-3400 may be run using several SOCestimates over a full range if SOC is unknown or the range in question.

At step 3450, the battery state of charge determination unit 150 may select the SOC that minimizes both the error and chance occurrence. This process may use the F statistic and the $r^2$ value, for example. F statistic may be a statistic that rates the probability of the correlation by chance and the $r^2$ statistic may be a ranking of fit. For instance, a good correlation $r^2$ may be realized but the correlation may be a chance occurrence. The F statistic may help avoid this chance occurrence.

Figure 12:
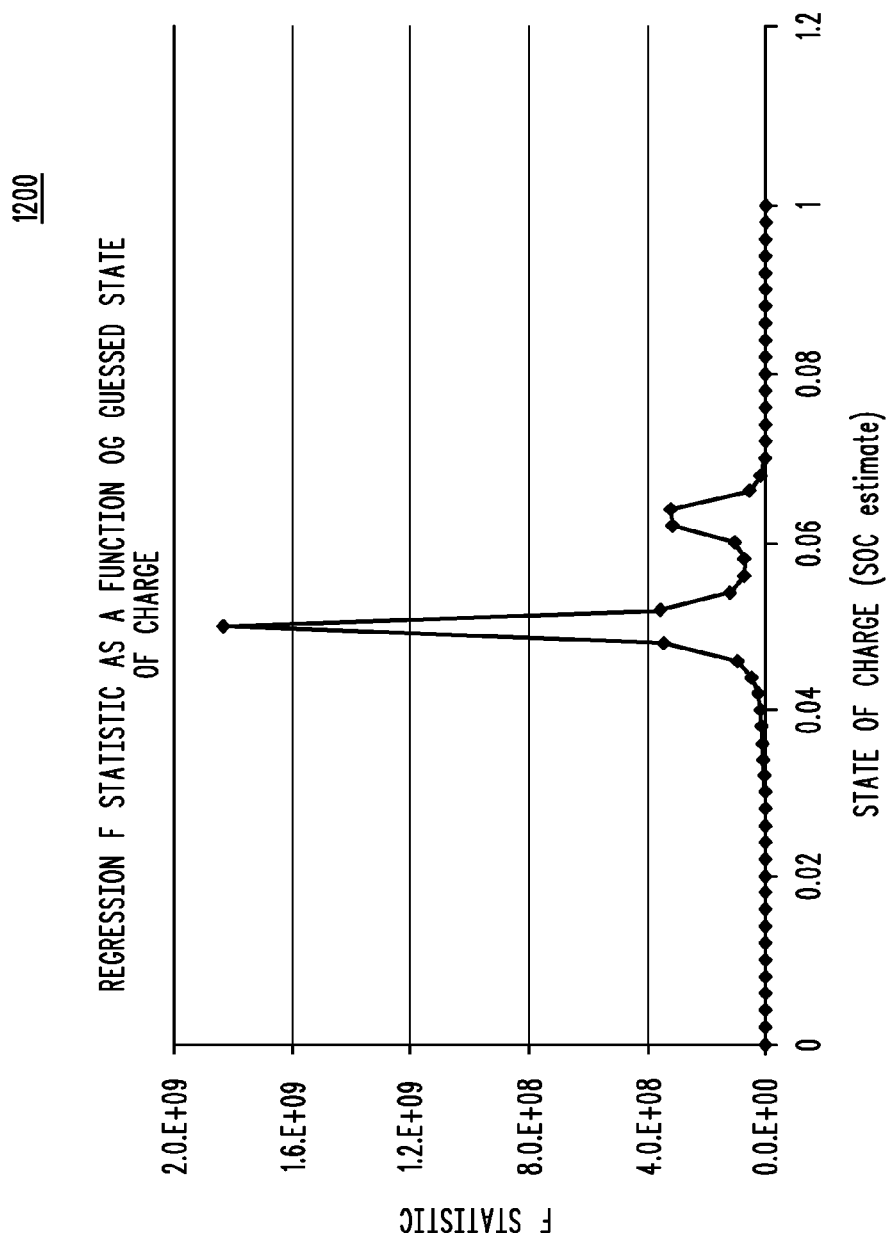
FIG. 12 is a graph of the F statistic of the regression discussed in the text as a function of SOC estimates.

In this process, a simple bisection algorithm may be run to maximize the F statistic. If there is a lot of noise in the data, the F statistic may have a maximum at two points. FIG. 12 is an example showing the calculated F statistic from regressions at different estimated state of charge values. The point that maximizes F and is realistic based on coulomb counting from previous know SOC points may be the one selected, for example.

Note that parametric equations and minimization of the regressed OCV and dOCV/dSOC relative to these baselined calculated curves may also be used. The essential idea may be that a function may be generated that may be minimized/optimized relative to SOC. The key criterion may be that it may be able to produce a single output. This "function" can be the difference from a parameterized curve or a calculated value from the regression like the F statistic, for example.

The F statistic may be preferred since it may help identify the negative feature of correlation by chance. If not identified, the chance correlation may lead to error. Thus, the SOC that minimizes both the error and chance occurrence may be the SOC that minimizes the F statistic.

At step 3500, the battery state of charge determination unit 150 may output the selected SOC for display to the user on the user interface 160. The process may then go to step 3550 and end.

Note that parameters not associated with state of charge may include values that are proportional to temperature only. In addition, SOC may directly obtained from a chart look up table using one of an Rup versus Rdown relationship, any capacity distribution perspective (CDP) derived parameter, and any higher order parameterized curves for two dimensional, three dimensional or four dimensional parametric curves.

The process may allow a state of health to be tracked using Rp2(T) or C, where Rp2(T) is polarization resistance relative to temperature, and C is capacitance. All resistance parameters may have a repeatable temperature characteristic. This may allow Temperature to be tracked using Rohmic (T) based on initial calibrated Rohmic (T) values at various temperatures or Rp2(T) based on initial calibrated Rp2(T) values at various temperatures, where Rp2(T) is polarization resistance relative to temperature, and Rohmic (T) is ohmic resistance relative to temperature.

Rp1(SOC,Ip)*Rp2(T) and Rohmic may be used to track pulse (discharge) and regen (charge) peak power or track pulse (discharge) and regen (charge) power at any current or voltage discharge, where Rp2(T) is polarization resistance relative to temperature, and Rohmic is ohmic resistance.

Figure 13:
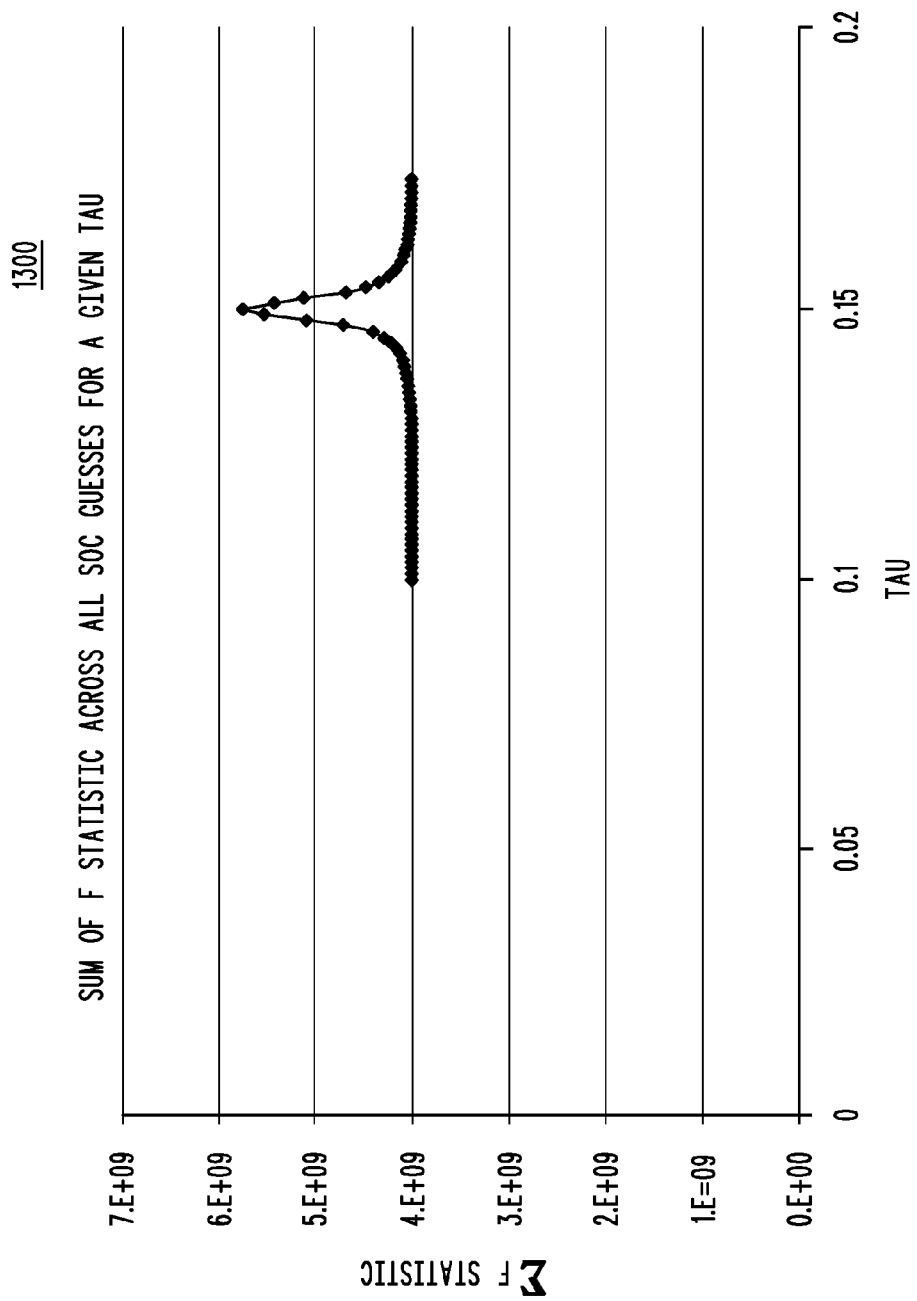
FIG. 13 is a graph of the sum of the F statistic across all the SOC estimates for the regression discussed in the text as a function of tau estimate.

During lengthy periods of use the double layer capacitance values may deviate from original numbers. This can occur if temperature changes in the battery. This process may calibrate tau independently of SOC and subsequently the double layer capacitance and may include:
  Receiving an initial value of tau.
  Calculate the F statistic as before for the range of SOC guesses.
  Sum all the F statistic values for all the guesses.
  Repeat using different values of tau.
  Produce a sum across SOC guesses of the F statistic as a function of tau ΣsocFstatistic(tau). This value may be shown for example, in FIG. 13.
  Choose the tau value that maximizes the F statistic sum over all SOC ranges.
  Calculate the double layer capacitance from the tau=Rp (T)*(dOCV/dSOC)^1/2*C/2, where Rp is polarization resistance, T is temperature, and C is capacitance.

During lengthy periods of use the total capacity of the cell may deviate from the original numbers. This process may calibrate the capacity and may be able to report remaining capacity:
A basic process may include:
  Calculate SOC1 per previous methods.
  Monitor Ah over a period of time.
  Recalculate SOC2 per previous methods.
  Calculate Capacity by Capacity=Ah/(SOC1−SOC2).

A more complex process may include:
  Track regressed values for OCV(SOC), dOCV/dSOC (SOC), (dOCV/dSOC(SOC))^1/2, tau, C, Rup versus Rdown, or any other derived CDP parameter across range of state of charge values; and
  Compare the tracked regressed values against parametric curves calculated for general chemistry OCV(SOC), dOCV/dSOC(SOC), and (dOCV/dSOC(SOC))^1/2, tau, C, Rup versus Rdown, or any other derived CDP parameter across an SOC range.
  For each parametric curve adjust capacity to minimize the deviation error of the parametric curve from the curve generated from multiple regressed values obtained at several states of charge.

The processes of the disclosed embodiments may be able to predict the end-of-life characteristics of a battery. This end-of-life prediction may include:
  Tracking capacity and making linear/nonlinear predictions.
  Tracking Rohmic and making linear/nonlinear predictions.
  Tracking Rp2(T) and making linear/nonlinear predictions.
  Tracking Max Power(SOC) and making linear/nonlinear predictions.
  Tracking Max Power(SOC) sweet spot for hybrid operation and making linear/nonlinear predictions and providing feedback to vehicle, satellite or spacecraft.
  Tracking Max Power(SOC) and making linear/nonlinear predictions and providing feedback to mechanic or maintenance specialist or operator.
  Tracking of the double layer capacitance and morphology changes and making linear/nonlinear predictions.

The processes of determining SOC in the disclosed embodiments may be robust for both low currents and high currents because of the CDP method and the derived observed resistance increases with the inverse of the square root. This unique property may allow accurate assessment of the voltage at low currents and high currents.

In addition, the disclosed embodiments may provide a process to de-convolute capacity and current so that state of health can be tracked separately from state of charge and temperature.

The disclosed embodiments may also provide a novel approach to monitoring of batteries behavior through the concept of distributed capacity or the Capacity Distribution Perspective (CDP). Other characteristics of the CDP can be used to generate more curves to determine state of charge, or other state of health characteristics. At a particular discharge voltage, only a fixed capacity may be available for discharge, but at a lower voltage, more capacity may be available. The resistance may be related to how much of the electrode may be contributing to the total current of the battery at any particular time. The CDP may allow the modeling of typical battery behavior where the resistance decreases with current. This value may have a confounding affect on SOC calculations if you try to regress at different discharge currents and at low states of charge where the OCV slope may be large and comparable to the resistance. This may make the process more robust when using data at different rates.

The CDP may also allow prediction of SOC from the up/down resistance differences when using the full calculation (the simplification may not give you this). The CDP may allow separation of capacity from resistance which may improve the accuracy of calculation of instantaneous power and peak power at low states of charge.

The simplification of the CDP polarization voltage may also provide a novel approach by allowing simple regression to be used in the process. CDP concept may also allow separation of diffusion polarization elements from temperature and degradation elements, for example.

The above processes provide many advantages and capabilities that may include the following:

Ability to predict max power equations to calculate available power on regen and pulse with CDP relationships.

Using up/down curvature parametric relationship for SOC indication.

Monitoring of State of health may be facilitated thought the use of the Rp2(T) term and the Rohmic.

Predicting temperature from the regressed Rp2(T) term without needing to actually measure it on the battery.

Prediction of Power at available rate as well as time at that rate.

Prediction of end voltage.

Predicting power at SOC and rate.

Calculating regression from a single data set as small as a single pulse.

Adaptive for capacity, temperature and resistance.

Aging or environmental condition may not affect ability of process to function properly.

Adaptability may allow keen integration advantages for hybrid systems that function at various temperatures and states of health.

Embodiments within the scope of the present disclosure may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof) to a computer, the computer properly views the connection as a computer-readable medium. Thus, any such connection may be properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that may be executed by computers in stand-alone or network environments. Generally, program modules include routines, programs, objects, components, and data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Although the above description may contain specific details, they should not be construed as limiting the claims in any way. Other configurations of the described embodiments of the disclosure may be part of the scope of this disclosure. For example, the principles of the disclosure may be applied to each individual user where each user may individually deploy such a system. This enables each user to utilize the benefits of the disclosure even if any one of the large number of possible applications do not need the functionality described herein. In other words, there may be multiple instances of the components each processing the content in various possible ways. It does not necessarily need to be one system used by all end users. Accordingly, the appended claims and their legal equivalents should only define the disclosure, rather than any specific examples given.

What is claimed is:

1. A method for estimating a state of charge (SOC) of a battery, comprising:

generating one or more curves with a processor, the generated one or more curves expressing an a priori relationship between a first parameter and the SOC of a battery over a region of interest;

taking a derivative with the processor of the generated one or more curves with respect to the SOC to generate a derived parameter with the SOC of the battery over the region of interest;

transforming with the processor a combination of the generated one or more curves into one or more supplemental curves to express the a priori relationship based on cell chemistry between a second parameter and one or more of current (I), polarization current (Ip), and open circuit voltage (OCV), and a voltage slope with respect to SOC (dOCV/dSOC);

measuring a voltage and a current of the battery during a period of time to create a set of voltage and current data;

processing with the processor the set of voltage and current data to create a set of processed data;

combining with the processor the one or more generated curves with the processed data to generate processed data as a function of SOC;

regressing with the processor the process data at multiple SOCs over the region of interest with respect to an equation which is representative of the battery to generate a curve that evaluates each SOC for accuracy;

selecting the SOC that minimizes errors; and outputting the selected SOC for display to a user on a user-interface;

wherein Rp1(SOC,Ip)*Rp2(T) and Rohmic is used to track pulse (discharge) and regen (charge) peak power or track pulse (discharge) and regen (charge) power at any current or voltage discharge, where Rp1(SOC,Ip) is polarization resistance relative to SOC, Rp2(T) is polarization resistance relative to temperature, and Rohrnic is ohmic resistance.

2. The method of claim 1, wherein the SOC that minimizes the error is an SOC that minimizes an F statistic.

3. The method of claim 1, wherein the battery-operated device is one of a car, a truck, an aircraft, a motorcycle, a scooter, a boat, a military transport or combatant, a portable computer, a mobile telephone, a satellite telephone, a satellite, a spacecraft, a submarine, a MP3 player, a personal digital assistant (PDA), a portable communication device, a portable radio, and a portable television.

4. A battery-operated device, comprising:

a battery;

a user interface; and a battery state of charge determination unit that generates one or more curves that express an a priori relationship between a first parameter and a state of charge (SOC) of the battery over a region of interest, takes a derivative of the generated one or more curves with respect to the SOC to generate a derived parameter with the SOC of the battery over the region of interest, transforms a combination of the generated one or more curves into one or more supplemental curves that express the a priori relationship between a second parameter with one or more of current (I), polarization current (Ip) and open circuit voltage (OCV), and a voltage slope with respect to SOC (dOCV/dSOC), measures a voltage and a current of the battery during a period of time to create a set of voltage and current data, processes the set of voltage and current data to create a set of processed data, combines one or more generated curves with the processed data to generate processed data as a function of SOC, regresses the process data function at multiple SOCs over the region of interest with respect to an equation which is representative of the battery to generate a curve that evaluates each SOC for accuracy, selects the SOC that minimizes errors, and outputs the selected SOC for display to a user on the user-interface, wherein $Rp1(SOC,Ip)*Rp2(T)$ and Rohmic is used to track pulse (discharge) and regen (charge) peak power or track pulse (discharge) and regen (charge) power at any current or voltage discharge, where $Rp1(SOC,Ip)$ is polarization resistance relative to SOC, $Rp2(T)$ is polarization resistance relative to temperature, and Rohmic is ohmic resistance.

5. The battery-operated device of claim 4, wherein the SOC that minimizes both the error and chance occurrence is the SOC that minimizes an F statistic.

6. The battery-operated device of claim 4, wherein the battery-operated device is one of a car, a truck, an aircraft, a motorcycle, a scooter, a boat, a military transport or combatant, a portable computer, a mobile telephone, a satellite telephone, a satellite, a spacecraft, a submarine, a MP3 player, a personal digital assistant (PDA), a portable communication device, a portable radio, and a portable television.

7. A non-transitory computer-readable medium storing instructions for controlling a computing device for estimating a state of charge (SOC) of a battery, the instructions comprising:

generating one or more curves that express an a priori relationship between a first parameter and the SOC of a battery over a region of interest;

taking a derivative of the generated one or more curves with respect to the SOC to generate a derived parameter with the SOC of the battery over the region of interest;

transforming a combination of the generated one or more curves into one or more supplemental curves to express the a priori relationship based on cell chemistry between a second parameter with one or more of current (I), polarization current (Ip), and open circuit voltage (OCV), a voltage slope with respect to SOC (dOCV/dSOC);

measuring a voltage and a current of the battery during a period of time to create a set of voltage and current data;

processing the set of voltage, 'rod current data to create a set of processed data;

combining one or more generated curves with the processed data to generate processed data as a function of SOC;

regressing the process data function at multiple SOCs over the region of interest with respect to an equation which is representative of the battery to generate a curve that evaluates each SOC for accuracy;

selecting the SOC that minimizes errors; and outputting the selected SOC for display to the user on a user-interface, wherein $Rp1(SOC,Ip)*Rp2(T)$ and Rohmic is used to track pulse (discharge) and regen (charge) peak power or track pulse (discharge) and regen (charge) power at any current or voltage discharge, where $Rp1(SOC,Ip)$ is polarization resistance relative to SOC, $Rp2(T)$ is polarization resistance relative to temperature, and Rohmic is ohmic resistance.

* * * * *